(12) United States Patent
Tu

(10) Patent No.: US 6,872,622 B1
(45) Date of Patent: Mar. 29, 2005

(54) METHOD OF FORMING A CAPACITOR TOP PLATE STRUCTURE TO INCREASE CAPACITANCE AND TO IMPROVE TOP PLATE TO BIT LINE OVERLAY MARGIN

(75) Inventor: Kuo-Chi Tu, Hsin-Chu (TW)

(73) Assignee: Taiwan Semiconductor Manufacturing Company, Hsinchu (TW)

( * ) Notice: Subject to any disclaimer, the term of this patent is extended or adjusted under 35 U.S.C. 154(b) by 370 days.

(21) Appl. No.: 10/119,335

(22) Filed: Apr. 9, 2002

(51) Int. Cl.$^7$ ...................... H01L 21/8242; H01L 21/20
(52) U.S. Cl. ...................... 438/253; 438/239; 438/381
(58) Field of Search ................................ 438/253, 197, 438/238, 239, 381, 396, 399

(56) References Cited

U.S. PATENT DOCUMENTS

| | | | |
|---|---|---|---|
| 5,798,289 A | 8/1998 | Ajika et al. | 438/239 |
| 5,956,587 A | 9/1999 | Chen et al. | 438/255 |
| 6,159,786 A | 12/2000 | Chiang et al. | 438/238 |
| 6,200,875 B1 | 3/2001 | Jang et al. | 438/396 |
| 6,294,426 B1 * | 9/2001 | Tu et al. | 438/255 |

* cited by examiner

Primary Examiner—David Zarneke
Assistant Examiner—Scott B. Geyer
(74) Attorney, Agent, or Firm—Thomas, Kayden, Horstemeyer & Risley

(57) ABSTRACT

A process for fabricating a capacitor under bit line (CUB), DRAM device, featuring increased capacitor storage node surface area, and increased overlay margin between storage node and bit line structures, has been developed. The process features the definition of hemispherical grain (HSG) silicon storage node shapes formed in storage node openings, and the definition of connecting HSG shapes formed in openings located adjacent to the storage node openings. This is accomplished dry etching procedures applied to portions of the HSG silicon layer not protected by a photoresist shape which in turn was obtained via partial exposure of, and development of, a photoresist layer. A polysilicon top plate structure, formed via polysilicon deposition and a following CMP procedure, results in a capacitor structure comprised with increased surface area as a result of the connected HSG silicon shapes. The ability to increase surface area via the connecting HSG silicon shapes allow ample space for definition of a bit line contact structure in a region located between capacitor structures.

27 Claims, 13 Drawing Sheets

METHOD OF FORMING A CAPACITOR TOP PLATE STRUCTURE TO INCREASE CAPACITANCE AND TO IMPROVE TOP PLATE TO BIT LINE OVERLAY MARGIN

BACKGROUND OF THE INVENTION (1) Field of the Invention

The present invention relates to methods used to fabricate semiconductor devices, and more specifically to a method used to fabricate a dynamic random access memory (DRAM) device featuring increased capacitance and improved capacitor top plate to bit line overlay margin.

(2) Description of Prior Art

Major objectives of DRAM manufacturers have been to increase DRAM density while still maintaining or increasing capacitance. To achieve increased DRAM density, or to increase the number of DRAM cells on a specific semiconductor chip, advanced photolithographic and dry etching disciplines have to employed. The smaller features obtained via advances in photolithographic exposure tools and procedures, as well as via advances in dry etching tools and processes, have allowed the attainment of DRAM cells comprised with sub-quarter micron features, to be routinely obtained, satisfying the density objectives. However the use of smaller features can negatively influence the attainment of other DRAM objectives such as the desired capacitance increases. For DRAM designs using stacked capacitor structures the objective of increased capacitance has been accomplished via increasing the height of the capacitor structure. However the path to taller capacitor storage nodes structures entails the use of thick insulator layers, subsequently resulting in a high aspect ratio for a bit line contact opening, for capacitor under bit line (CUB) designs. In addition the more tightly packed DRAM features reduce the space needed for adequate isolation between the bit line contact, and storage node structures, while demanding stringent overlay requirements.

This invention will describe a novel procedure and design for a DRAM cell, in which cell capacitance can be increased without increasing the height of the storage node structures, as well as providing adequate isolation between, and relaxing the overlay margin, bit line and storage node structures as used in a CUB design. A novel top plate definition sequence, employing photolithographic, dry etching and chemical mechanical polishing (CMP) procedures, are described allowing both the desired increased capacitance to be accomplished without increasing the aspect ratio for the opening of the bit line contact hole. Prior art such as Chen et al, in U.S. Pat. No. 5,956,587, as well as Ajika et al, in U.S. Pat. No. 5,798,289, offer processes for fabricating capacitor structures. These prior arts however do not describe the novel process sequence described in this present invention in which a combination of photolithographic, dry etching, and CMP processes are used to form a capacitor structure with the desired increased capacitance objectives.

SUMMARY OF THE INVENTION

It is an object of this invention to employ a fabrication sequence for a DRAM device in which DRAM capacitance, as well as the isolation, as well as the overlay margin, between the capacitor top plate and bit line structures are optimized.

It is another object of this invention to use a process sequence comprised of: chemical mechanical polishing (CMP) of a photoresist layer, partial exposure of the polished photoresist layer; and plasma etching; to form openings, adjacent to taller storage node openings.

It is still another object of this invention to form a storage node structure, comprised of hemispherical grain (HSG), silicon, located in a storage node opening, and: adjacent opening.

It is still yet another object of this invention to employ a polysilicon deposition procedure followed by a CMP procedure, to form a capacitor top plate structure in a storage node opening, and in the opening adjacent to the storage node opening, with the capacitor top plate structure overlying the storage node structure located in both type openings.

In accordance with the present invention a method of forming a DRAM device featuring a capacitor structure comprised of a storage node structure, formed in storage node opening, and formed in a shortened opening located adjacent to the storage node opening, with the storage node components connected by an overlying capacitor top plate structure, is described. After formation of transfer gate transistors self-aligned contact (SAC) openings are formed in a first insulator exposing portions of source/drain regions formed in areas of a semiconductor substrate not covered by the transfer gate transistors. After formation of plug structures in the openings in the first insulator layer a silicon nitride stop layer is deposited, followed by deposition of a second insulator layer. Storage node openings are formed in the second insulator layer and in the silicon nitride layer exposing the top surface of plug structures to be used as storage node plug structures. A hemispherical grain (HSG) silicon layer is formed contouring all surfaces of the storage node openings, as well as the top surface of the second insulator layer. A photoresist layer is then applied, planarized, and partially exposed and developed, allowing a selective dry etch procedure to remove HSG silicon from the top surface of the second insulator layer, as well to remove a portion of HSG silicon from a top portion of a side of the storage node structures. Another dry etch procedure is then used to selectively remove the portions of second insulator layer located between storage node structures, with the dry etch procedure terminating at the top surface of the underlying silicon nitride layer, resulting in shortened openings between storage node structures, with one side of the shortened openings lined with the shortened HSG silicon shape, while another side of the shortened opening is lined with a non-shortened HSG silicon shape. After formation of a capacitor dielectric layer a polysilicon layer is deposited filling the storage node, and the shortened openings. A CMP procedure is then used to remove unwanted portions of polysilicon resulting in formation of a polysilicon capacitor top plate located in the storage node openings, and in the shortened openings, with a top portion of the polysilicon capacitor top plate structure connecting the polysilicon components located in both openings. After deposition of a third insulator layer a bit line contact opening is formed in the third insulator layer, in a region of the second insulator layer located between capacitor structures, and in the silicon nitride layer, exposing a potion of the top surface of a plug structure to be used for as a bit line contact plug structure. The bit line contact structure is then formed in the bit line contact opening, with a bit line structure defined overlying a portion of the third insulator layer, located in a region between underlying storage node structures.

BRIEF DESCRIPTION OF THE DRAWINGS

The object and other advantages of this invention are described in the preferred embodiments with reference to the attached drawings that include.

DESCRIPTION OF THE PREFERRED EMBODIMENTS

Figure 1:
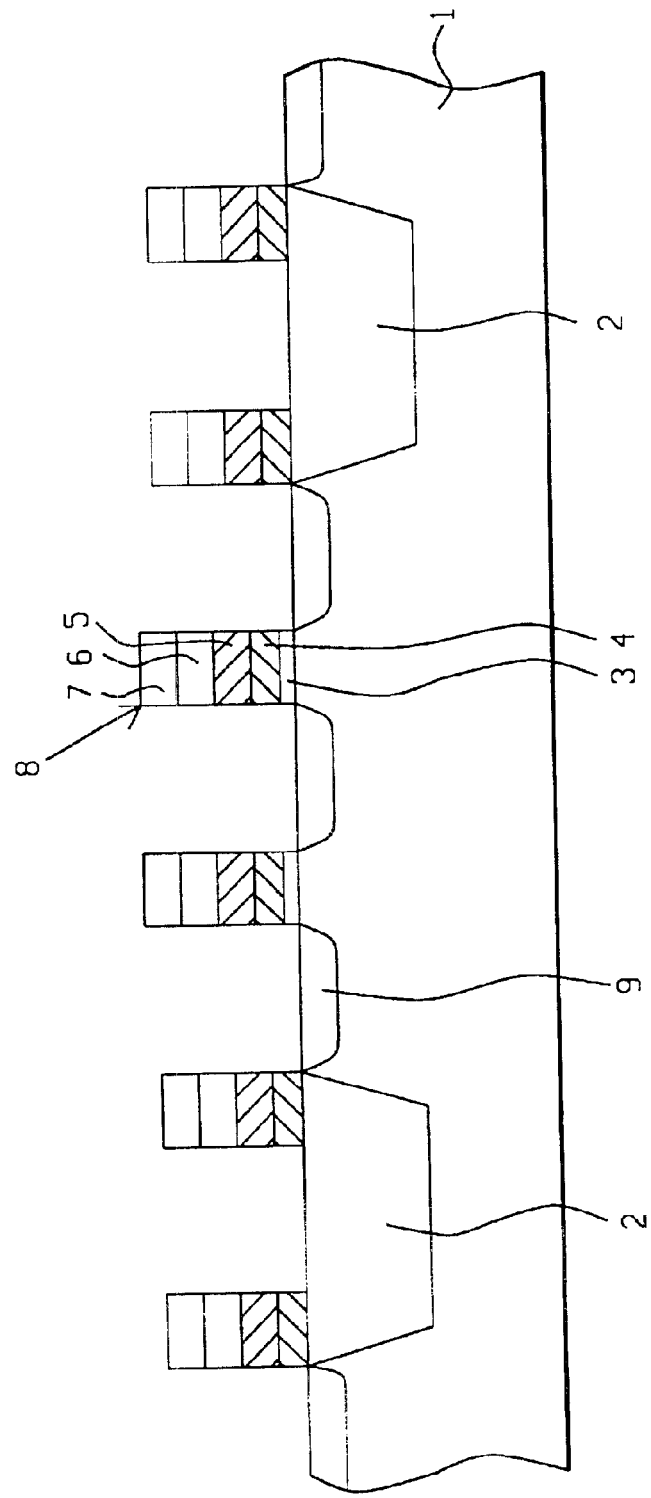
FIGS. 1–13, which schematically in cross sectional style describe key stages of fabrication used for formation of a DRAM device featuring a capacitor structure comprised of storage node structures formed in storage node openings, and in openings formed adjacent to the storage node openings, with the storage node components connected by an overlying capacitor top plate structure.

The method of forming a DRAM device featuring a capacitor structure comprised of storage node structures, formed in storage node openings, and in openings formed adjacent to storage node openings, with the storage node components connected by an overlying capacitor top plate structure, will now be described in detail. Semiconductor substrate 1, comprised of P type, single crystalline silicon, with a <100> crystallographic orientation, is used and schematically shown in FIG. 1. Insulator filled, shallow trench isolation (STI) regions 2, are formed via definition of shallow trench shapes in top portions of semiconductor substrate 1, using photolithographic and dry etching procedures, followed by filling of the shallow trench shapes with a chemically deposited insulator layer. Removal of portions of the insulator layer from the top surface of semiconductor substrate 1, using chemical mechanical polishing (CMP), or via selective dry etch procedures, complete the STI formation procedure. Silicon dioxide gate insulator layer 3, is next formed on top portions of semiconductor substrate 1, not occupied by STI regions 2, at a thickness between about 20 to 80 Angstroms, via thermal oxidation procedures. Polysilicon layer 4, is next deposited via low pressure chemical vapor deposition (LPCVD), procedures, at a thickness between about 500 to 1000 Angstroms. Polysilicon layer 4, is either doped in situ during deposition via the addition of arsine, or phosphine, to a silane ambient, or polysilicon layer 4, is deposited intrinsically then doped via implantation of arsenic or phosphorous ions. Metal silicide layer 5, such as tungsten silicide, is now deposited via LPCVD procedures at a thickness between about 500 to 1500 Angstroms, using tungsten hexafluoride and silane as reactants. Silicon oxide layer 6, is next deposited at a thickness between about 500 to 1500 Angstroms, via LPCVD or plasma enhanced chemical vapor deposition (PECVD), procedures, using tetraethylorthosilicate (TEOS) as a source, followed by deposition of silicon nitride layer 7, obtained at a thickness between about 500 to 1500 Angstroms, via LPCVD or PECVD procedures. Photolithographic and anisotropic, reactive ion etching (RIE) procedures, using $Cl_2$ as an etchant for silicon nitride, tungsten silicide, and polysilicon, and using $CHF_3$ as an etchant for silicon oxide, are employed to define gate structures 8, shown schematically in FIG. 1. After removal of the photoresist shape used for definition of gate structures 8, via plasma oxygen ashing, source/drain regions 9, are formed in regions of semiconductor substrate 1, not covered by gate structures 8, via implantation of arsenic or phosphorous ions, at ab energy between about 15 to 40 KeV, and at a dose between about 1E12 to 1E14 atoms/cm$^2$.

Figure 2:
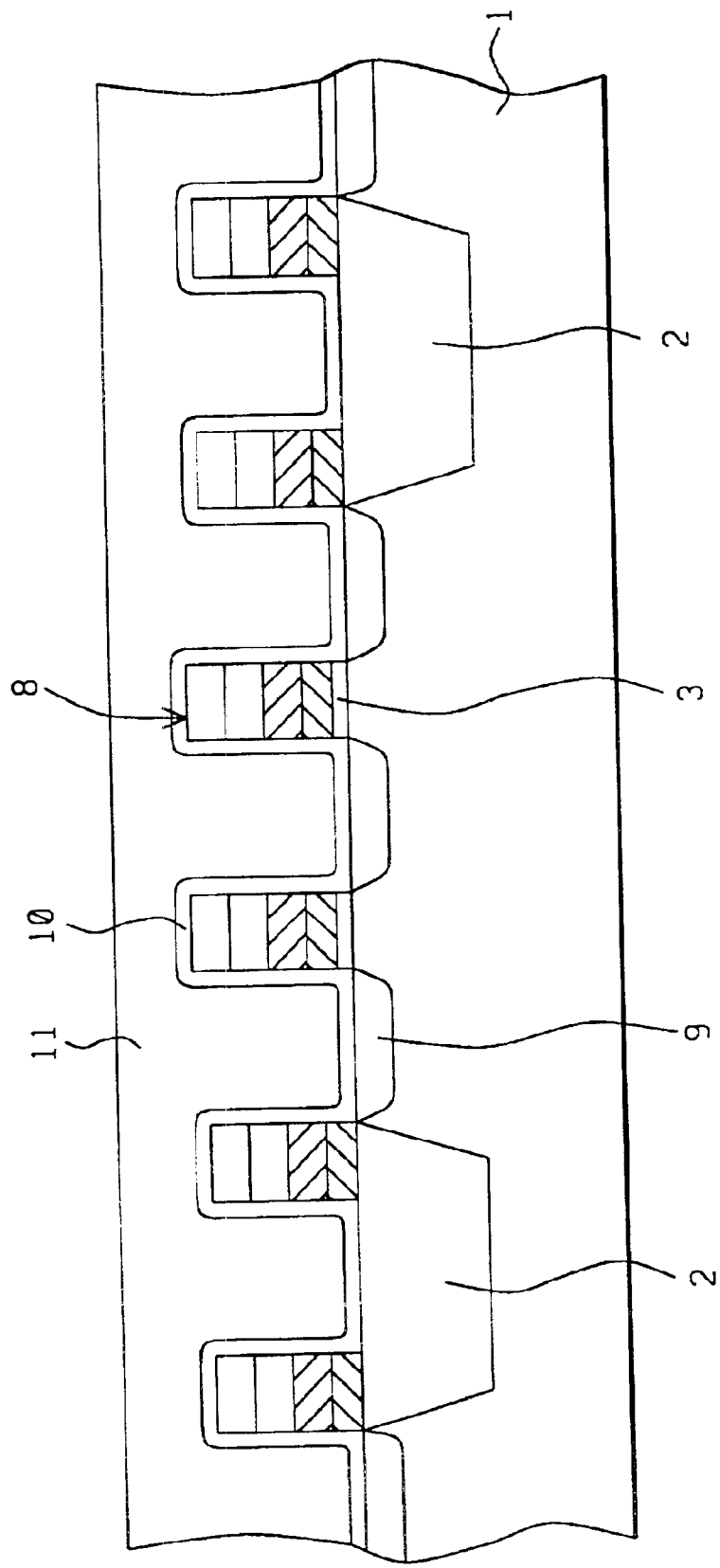

Silicon nitride layer 10, is next deposited via LPCVD or PECVD procedures, to a thickness between about 300 to 600 Angstrorms, contouring all surfaces of gate structures 8. Insulator layer 11, comprised of either silicon oxide, or a boro-phosphosilicate glass (BPSG) layer, is then deposited to a thickness between about 6000 to 10000 Angstroms, again via LPCVD or PECVD procedures. A chemical mechanical polishing (CMP), procedure is employed for planarization purposes, resulting in a smooth top surface topography for insulator layer 11. The result of these procedures is schematically shown in FIG. 2.

Figure 3:
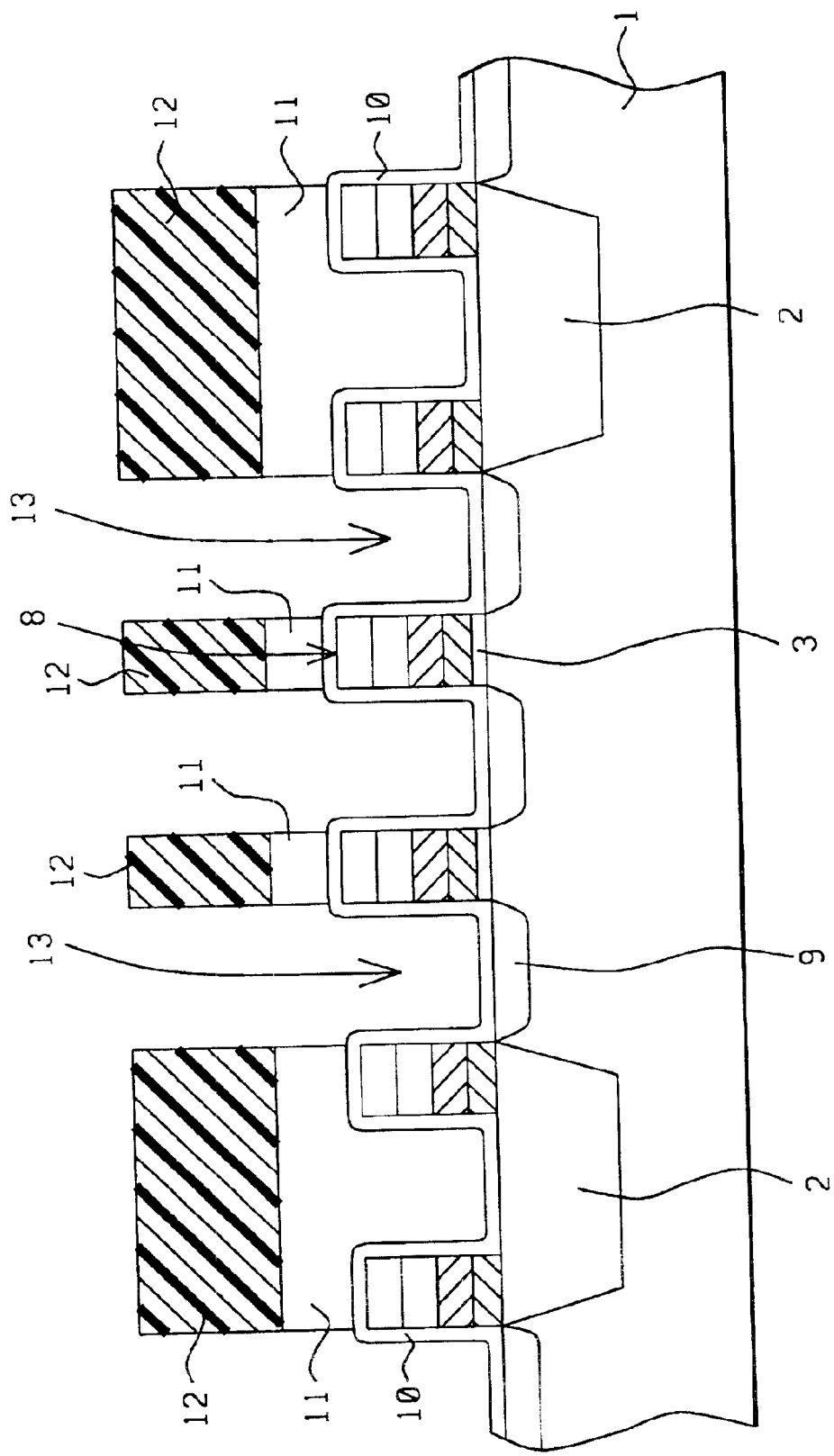

Photoresist shape 12, is next formed and used as an etch mask allowing self-aligned contact (SAC) openings, 13, located between gate structures 8, to be defined in insulator layer 11, and in the portion of silicon nitride layer 10. Openings in photoresist shape 12, are larger in diameter than the space between gate structures 8, allowing a first phase of the SAC RIE procedure to selectively remove exposed regions of insulator layer 11, using $CHF_3$ as a selective etchant, without etching exposed silicon nitride regions. The second phase of the SAC RIE procedure employs $CF_4$ or $Cl_2$ as a selective etchant for silicon nitride, allowing this anisotropic RIE procedure to remove only the portions of silicon nitride layer 10, located in a direction normal to the anisotropic plasma, exposing portions of the top surface of source/drain regions 9. This is schematically shown in FIG. 3.

Figure 4:
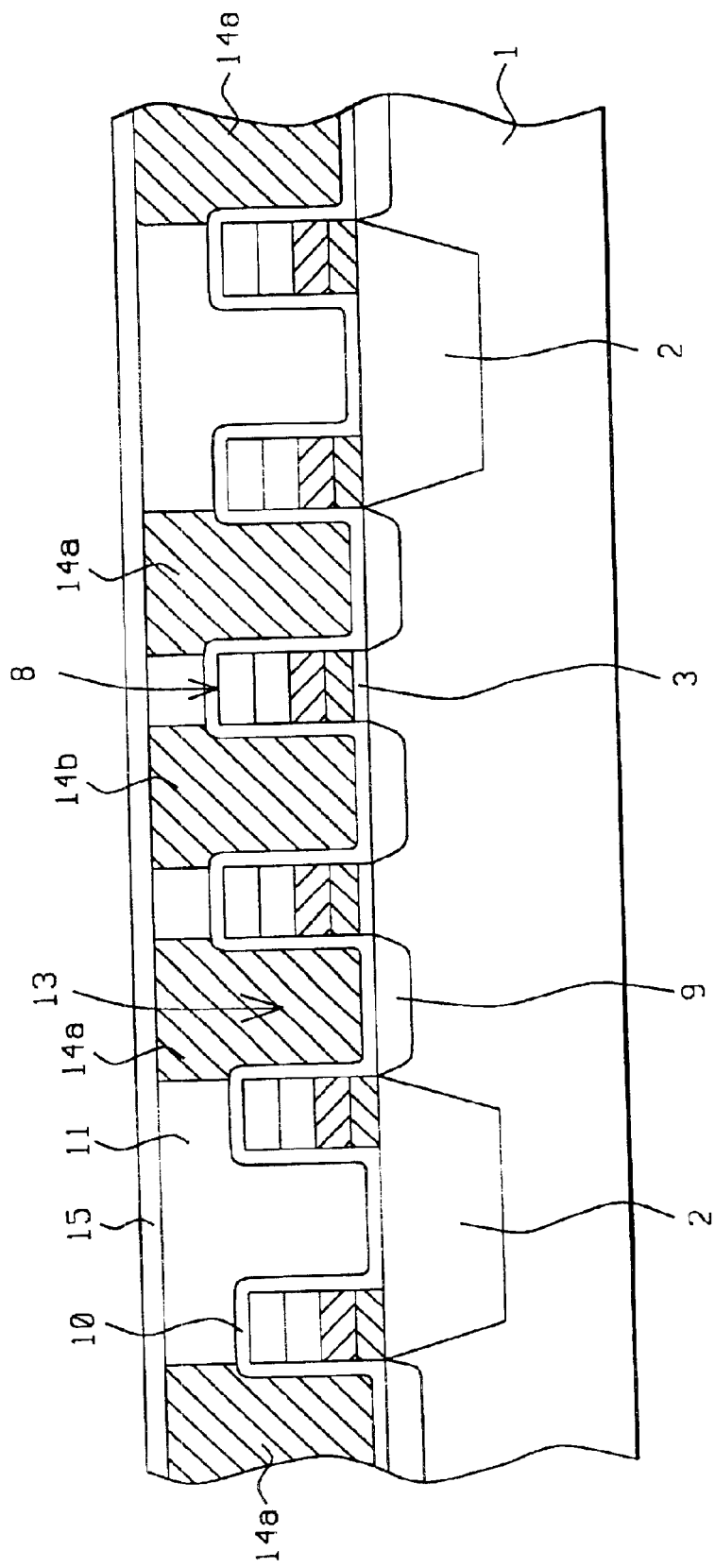

A polysilicon layer is next deposited via LPCVD procedures, at a thickness between about 4000 to 6000 Angstroms, completely filling SAC openings 13. The polysilicon layer is either doped in situ during deposition via the addition of arsine, or phosphine, to a silane ambient, or the polysilicon layer is deposited intrinsically then doped via implantation of arsenic or phosphorous ions. Removal of portions of the polysilicon layer residing on the top surface of insulator layer 11, is accomplished via CMP, or via a selective RIE procedure, using $Cl_2$ as an etchant, resulting in definition of polysilicon storage node contact plugs 14a, and in definition of polysilicon bit line contact plug 14b, located in SAC openings 13. Silicon nitride layer 15, to be used as a stop layer for subsequent, selective dry etch procedures, is now deposited at a thickness a between about 200 to 500 Angstroms, via LPCVD or PECVD procedures. The result of these procedures is schematically shown in FIG. 4.

Figure 5:
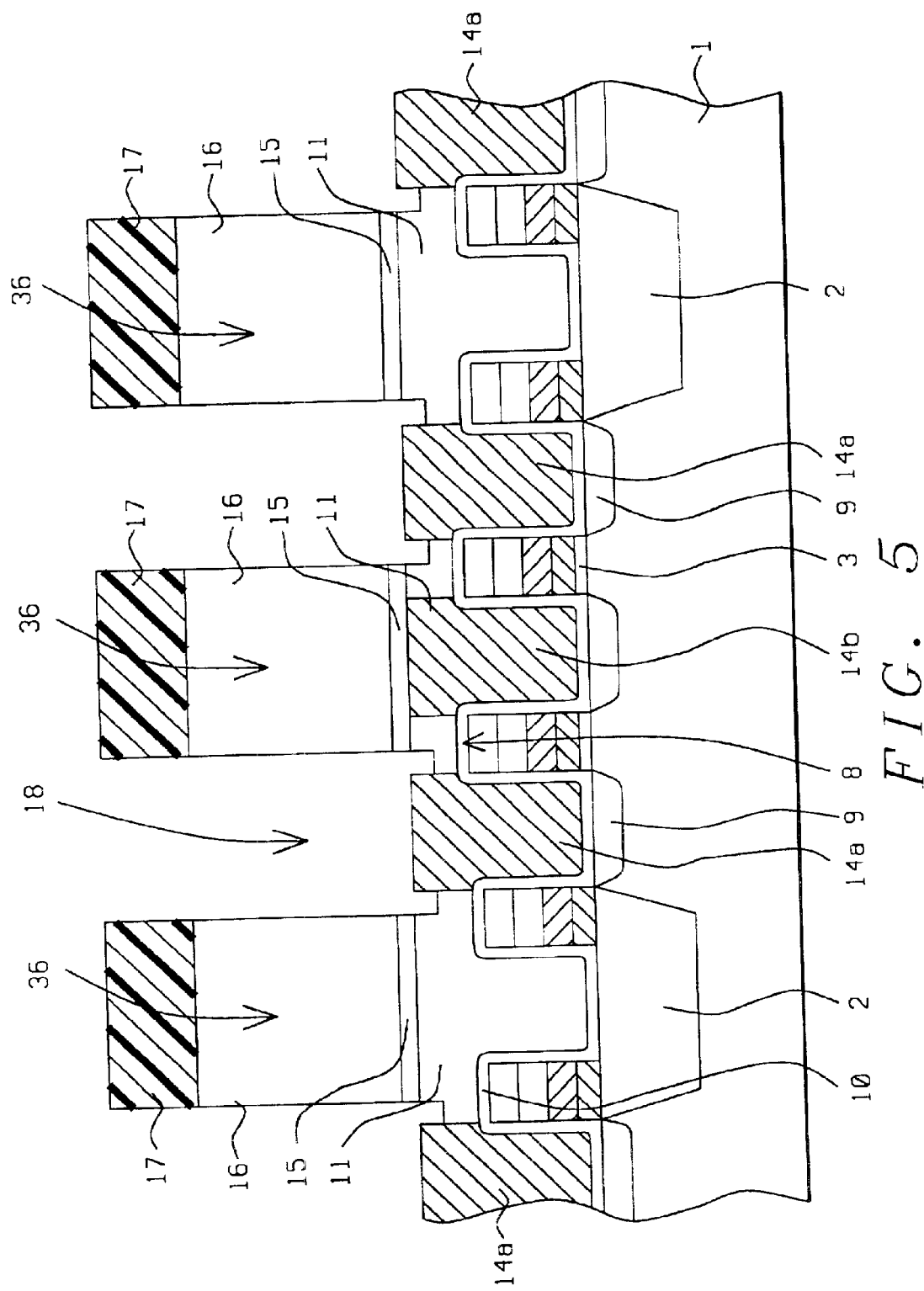

Insulator layer 16, again comprised of either silicon oxide, or BPSG, is next deposited via LPCVD or PECVD procedures, at a thickness between about 5000 to 20000 Angstroms. Photoresist shape 17, is then formed with an opening wider than the width of a polysilicon plug structure, then used as an etch mask to allow storage node openings 18, to be defined in insulator layer 16, and in silicon nitride layer 15, exposing the top surface of polysilicon storage node contact plugs 14a. Storage node openings 18, schematically shown in FIG. 5, are formed via a first phase of an anisotropic RIE procedure using $CHF_3$ as a selective etchant for insulator layer 16, terminating at the appearance of silicon nitride stop layer 15, then followed by a second phase of the anisotropic RIE procedure, using $CF_4$ as an etchant for silicon nitride. An over etch cycle, used at the conclusion of the second phase of the anisotropic RIE procedure, results in removal of a top portion of exposed insulator layer 11. Tis over etch cycle creates the notch in insulator layer 11, allowing an increase in the surface area of storage node openings 18, to be realized. The definition of storage node openings 18, in insulator layer 16, also results in the definition of insulator shapes 36, comprised of unetched portions of insulator layer 16. Removal of photoresist shape 17, is accomplished via plasma oxygen ashing procedures.

Figure 6:
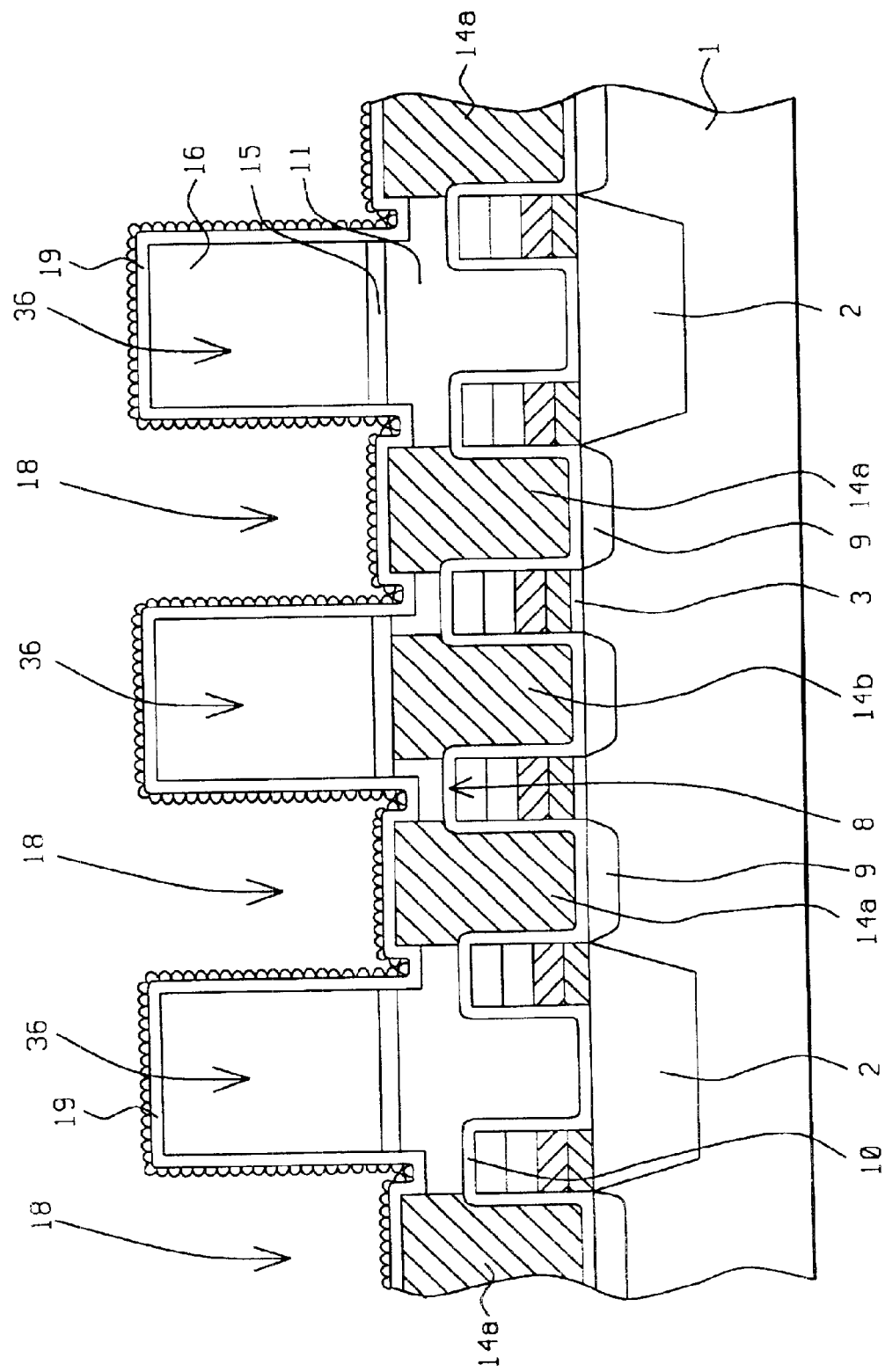

FIG. 6, schematically shows the result of forming hemispherical grain (HSG) silicon layer 19. A polysilicon or amorphous silicon layer is first deposited followed by an anneal procedure used to form large silicon grains in a top portion of the polysilicon or amorphous silicon layer, resulting in HSG silicon layer 19. HSG silicon layer 19, is represented in FIG. 6, by by the thickness of the large silicon grain component and of the underlying bottom portion of the polysilicon or amorphous silicon layer. HSG silicon layer 19, contours all surfaces of storage node openings 18, including coverage in the recessed or notched regions in insulator layer 11, as well as contouring and covering surfaces of insulator shapes 36.

Figure 7:
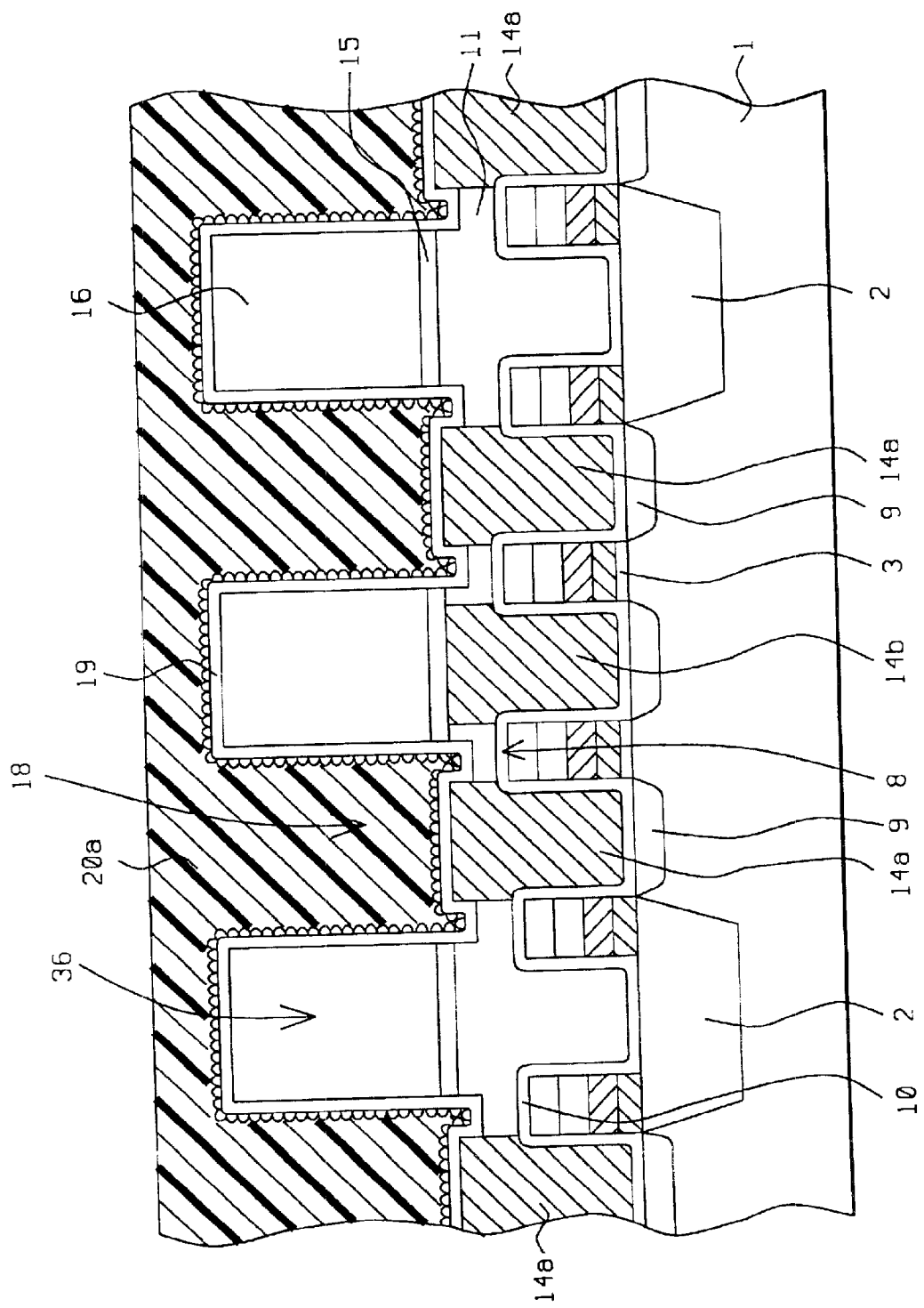
Figure 8:
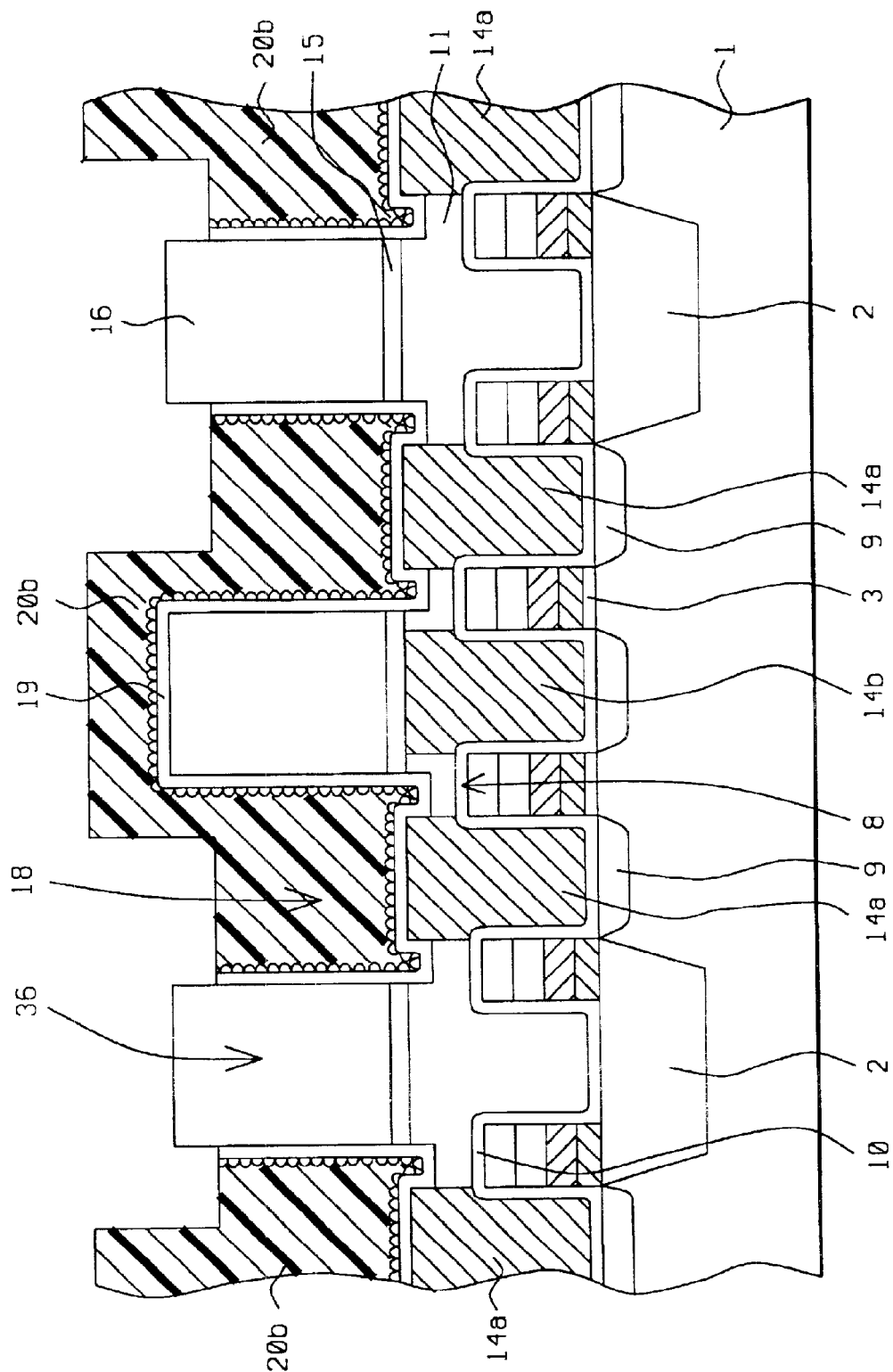
Figure 9:
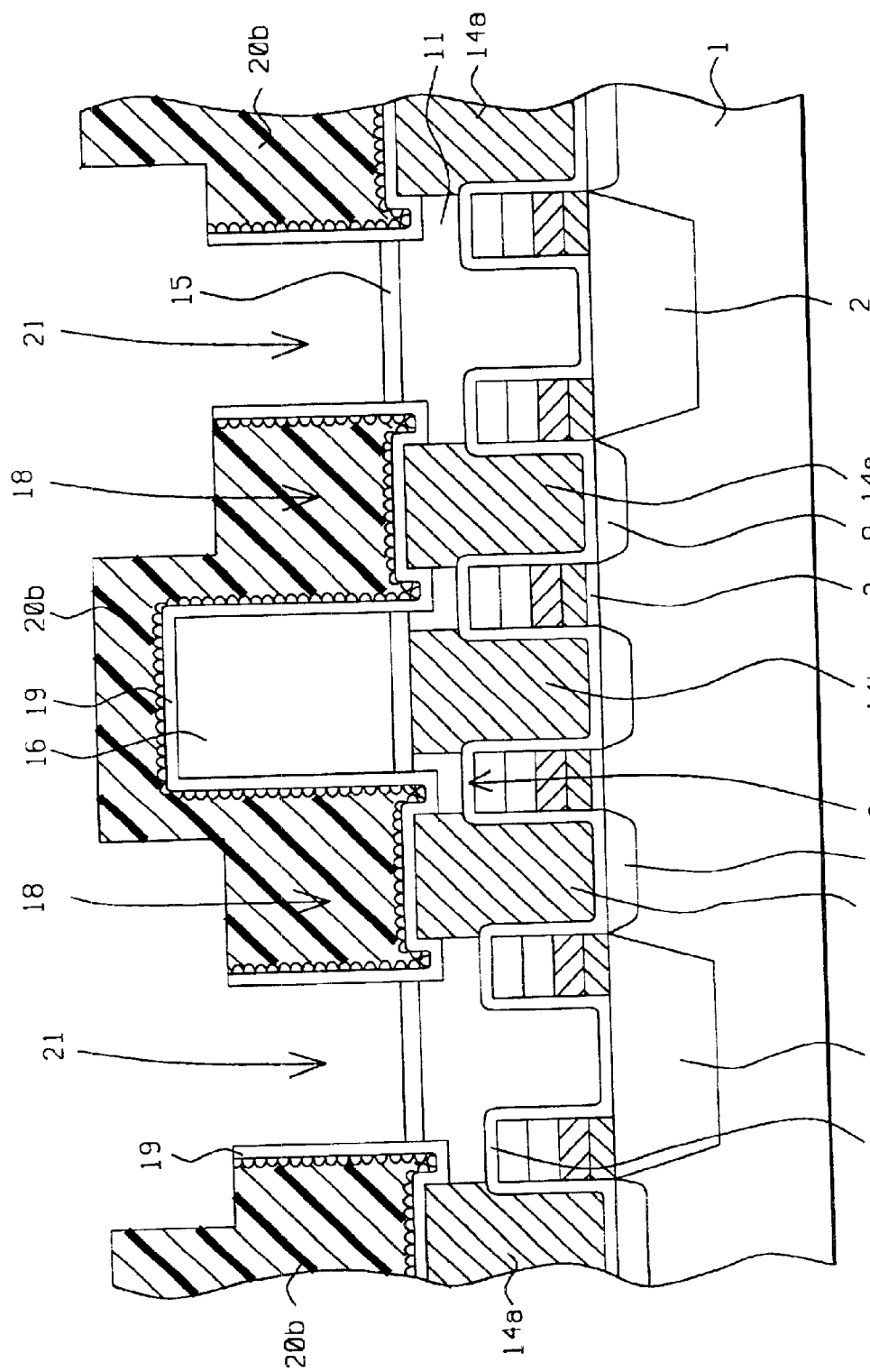

Photoresist layer 20a, shown schematically in FIG. 7, is next applied, completely covering the entire underlying topography. Exposure of, and development of, specific portions of photoresist layer 20a, result in the definition of photoresist shape 20b, with openings in photoresist shape 20b, exposing the top surfaces of, as well as top portions of the sides of, insulator shapes 36. At this stage of the process HSG silicon layer 19, still resides on the exposed portions, or the portions of insulator shapes 36, not covered by photoresist shape 20b. A first phase of a selective RIE procedure, is now employed to remove portions of HSG silicon layer 19, from the areas of insulator shapes 36, not protected by photoresist shape 20b. The selective RIE procedure is performed using $Cl_2$ as an etchant for silicon. This is schematically shown in FIG. 8. A second phase of the selective RIE procedure is now used to remove insulator shapes 36. This phase of the selective RIE procedure is performed using $CHF_3$ as an etchant for insulator shapes 36, formerly comprised of insulator layer 16. The second phase of the selective RIE procedure exhibits a high etch rate ratio of insulator layer 16, to silicon nitride, therefore terminating at the appearance of silicon nitride stop layer 15. In addition the second phase of the selective RIE procedure also features a high etch rate ratio of insulator layer 16, to HSG silicon layer 19, therefore not removing the portions of HSG silicon layer 19, now located in shortened opening 21, which were previously occupied by insulator shapes 36. This is schematically shown in FIG. 9. At the conclusion of the second phase of the selective RIE procedure photoresist shape 20b, is removed via plasma oxygen ashing procedures.

Figure 10:
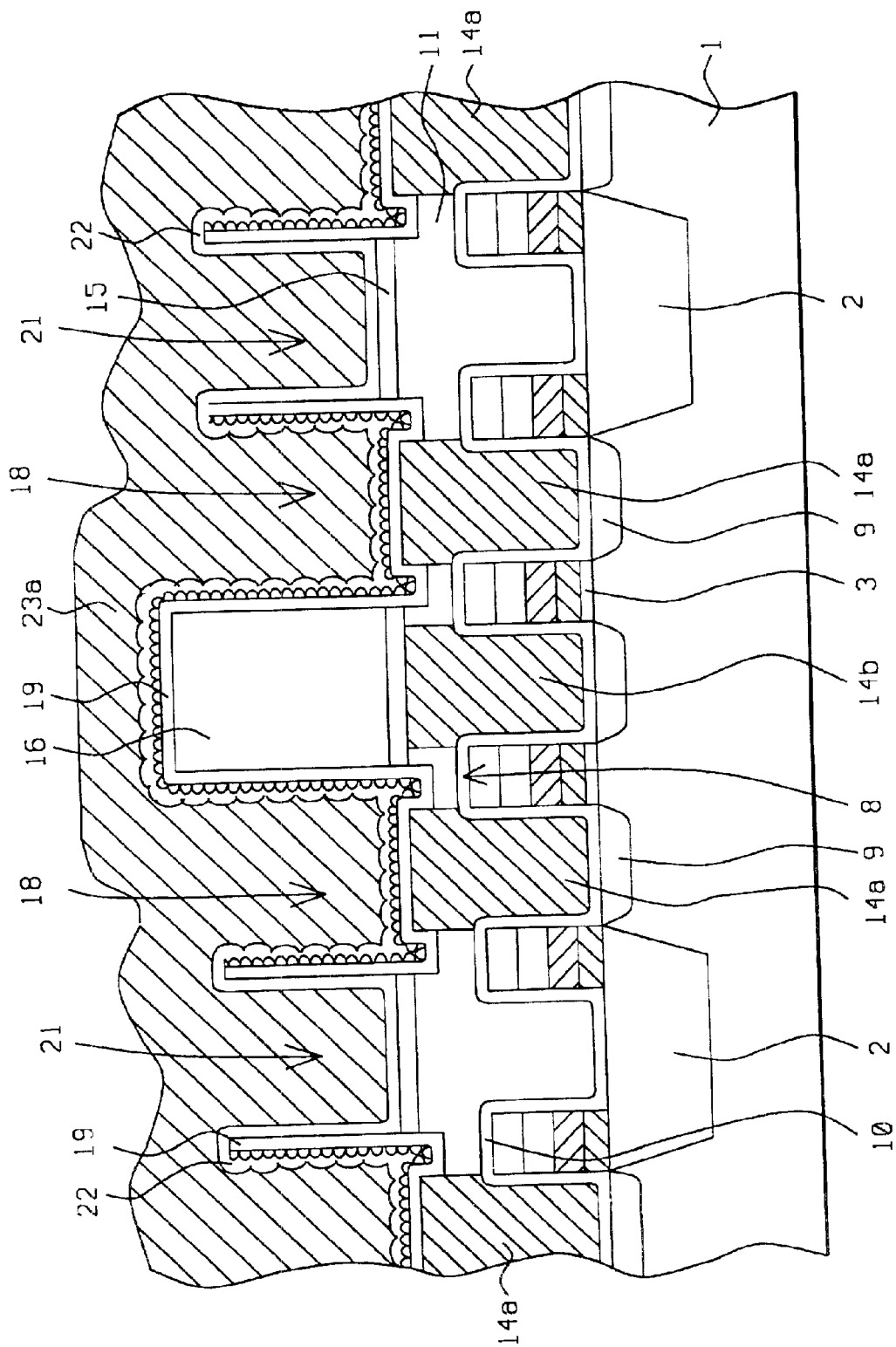

Capacitor dielectric layer 22, is next formed on all surfaces of HSG silicon layer 19, such as the surfaces of HSG silicon located in storage node openings 18, and located on the sides of shortened openings 21. Capacitor dielectric layer 22, is also formed on top surface of insulator layer 16, located between storage node openings, and on the portion of silicon nitride layer 15, located at the bottom of shortened openings 21. Capacitor dielectric layer 22, formed at a thickness between about 30 to 70 Angstroms, can be comprised of an oxidized silicon nitride on silicon oxide (ONO) layer. This would be formed via deposition of a composite layer comprised of an overlying silicon nitride layer on a silicon oxide layer, followed by thermal oxidation of the overlying silicon nitride layer. If desired capacitor dielectric layer 22, can also be comprised of oxidized silicon nitride (NO) layer, or of a tantalum oxide layer. Polysilicon layer 23a, is next deposited via LPCVD procedures, to a thickness between about 3000 to 6000 Angstroms, completely filling storage node openings 18, and shortened openings 21, while completely covering HSG silicon covered, insulator layer 16, shape, located between storage node openings. Polysilicon layer 23a, can be doped in situ during deposition via the addition of arsine, or phosphine to a silane ambient, or polysilicon layer 23a, can be deposited intrinsically then doped via implantation of arsenic or phosphorous ions. The result of the procedures described above is schematically shown in FIG. 10.

Figure 11:
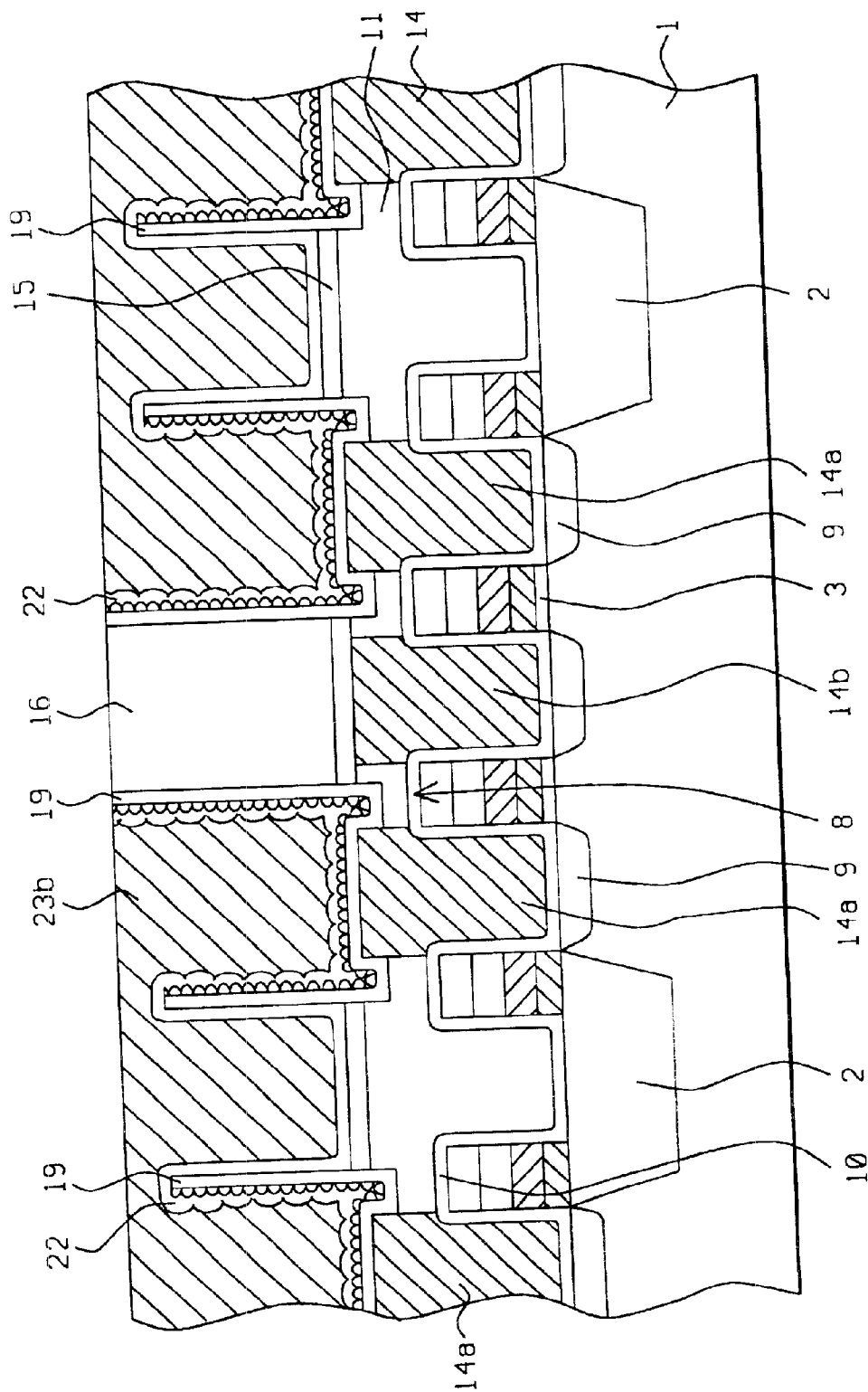

A critical CMP procedure is now employed for planarization purposes, and to selectively remove exposed silicon regions. The CMP procedure removes portions of polysilicon layer 23a, in addition to removing the portion of HSG silicon layer residing on the top surface of insulator layer 16. This results in the definition of polysilicon top plate structures 23b, with each polysilicon top plate structure located in both a storage node opening 18, as well as in shortened opening 21. Since both the storage node openings and shortened openings are lined with the composite capacitor dielectric layer —HSG silicon layer, the addition of the overlying polysilicon top plate structures result in increased capacitor surface area as a result of the connecting portions. This is schematically shown in FIG. 11.

Figure 12:
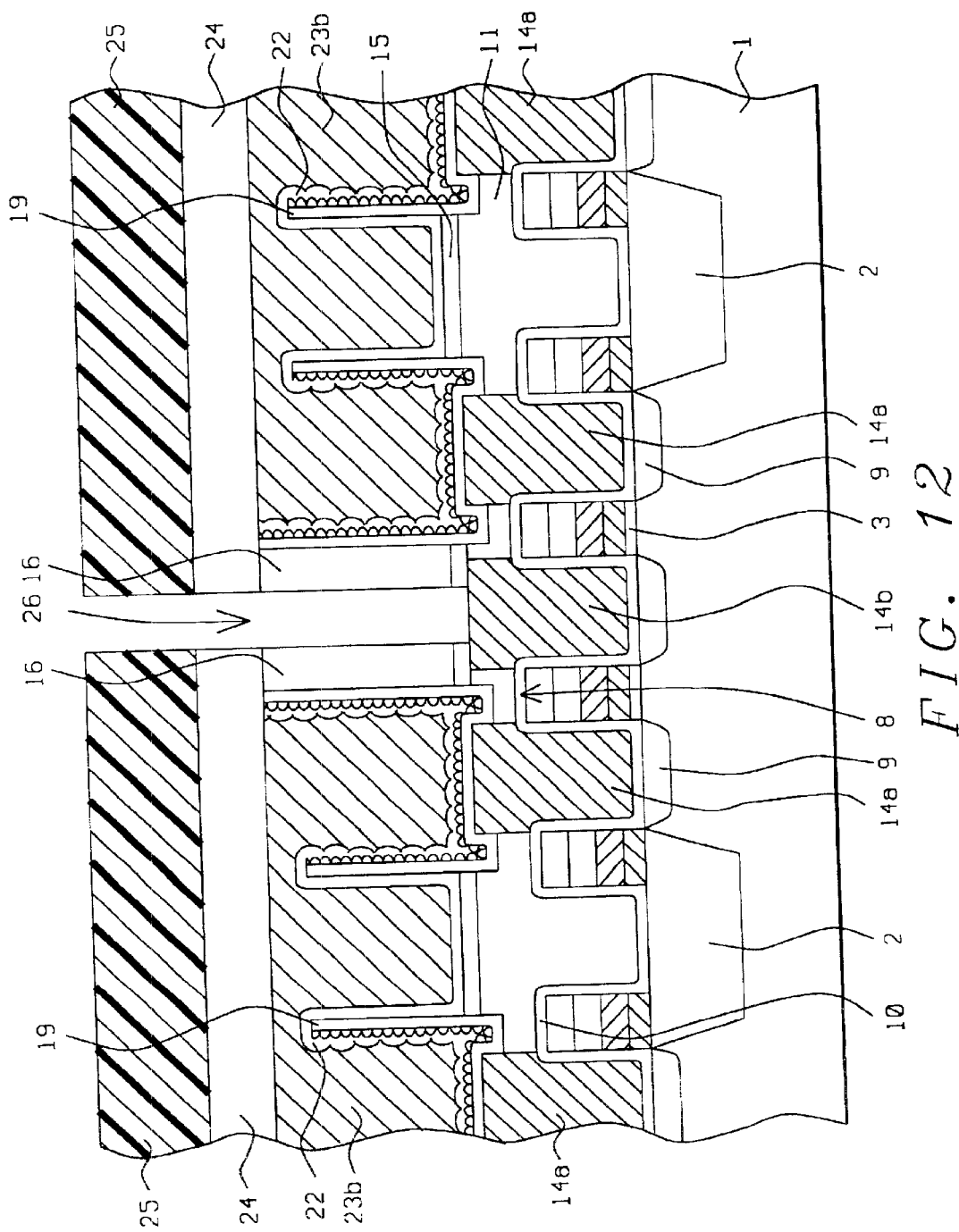

Since the desired increase in capacitor surface area was accomplished via connecting storage node regions, removing the need to fabricate taller storage node structure, the aspect ratio for definition of a bit line contact opening is reduced. Insulator layer 24, comprised of either silicon oxide or BPSG, is deposited via LPCVD or PECVD procedures, at a thickness between about 2000 to 4000 Angstroms. Photoresist shape 25, is then used as an etch mask to allow an anisotropic RUE procedure to define bit line contact opening 26, in insulator layer 24, insulator layer 16, and in silicon nitride stop layer 15. The anisotropic RIE procedure, employed using $CHF_3$ for insulator layer 24, and for insulator layer 16, while using $CF_4$ as an etchant for silicon nitride stop layer 15, results in exposure of a portion of the top surface of polysilicon bit line contact plug 14b. This is schematically shown in FIG. 12. Photoresist shape 25, is now removed via plasma oxygen ashing procedures. The ability to provide the needed capacitance via connecting storage node structures, in addition to allowing a reduction in the depth of the bit line opening to be realized, also allowed a larger space between capacitor structures to be available for the bit line contact opening, thus relaxing the overlay requirements for placement of this opening.

Figure 13:
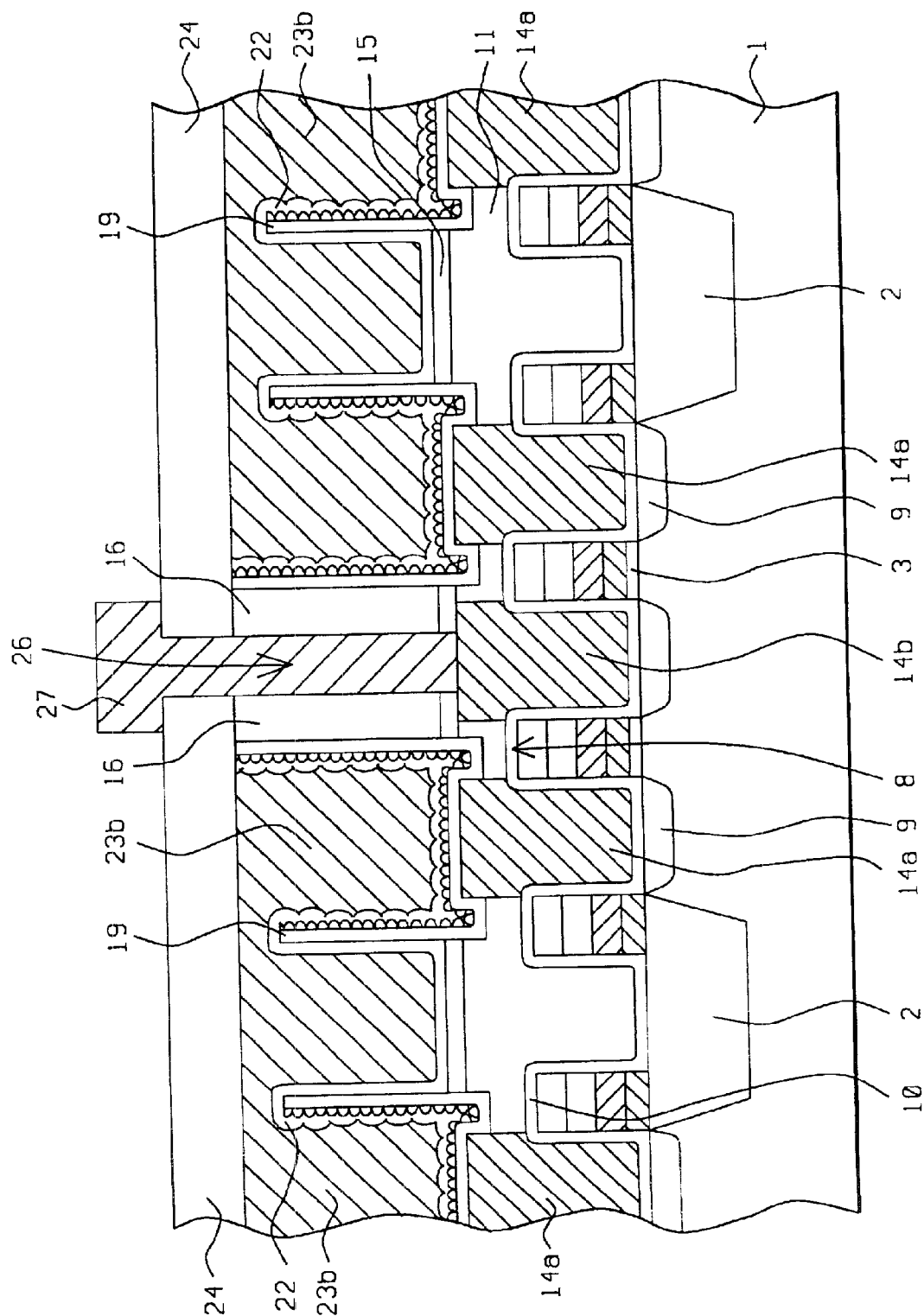

A metal layer, such as aluminum, aluminum-copper, or tungsten, is next deposited at a thickness between about 2000 to 4000 Angstroms, completely filling bit line contact opening 26, as well as depositing on the top surface of insulator layer 24. Photolithographic and dry etching procedures, using $Cl_2$ as an etchant for exposed portions of the metal layer, is used to define bit line structure 27, comprised with a first portion residing in bit line contact opening 26, and with a second portion residing on a top surface of insulator layer 24. This is schematically shown in FIG. 13. The photoresist shape used for definition of bit line structure 27, is then removed again using plasma oxygen ashing procedures.

It should be noted that although this invention has described for shortened openings formed adjacent to storage node openings, for purposes of increasing capacitor surface area, other designs such as a window polysilicon top plate can also be comprised with strategically placed, specific shortened openings, again allowing increased capacitor surface area to be realized. These shortened openings would be formed using the identical process sequence used for the previously featured shortened openings.

While this invention has been particularly shown and described with reference to, the preferred embodiments thereof, it will be understood by those skilled in the art that various changes in form and details may be made without departing from the spirit and scope of this invention

What is claimed is:

1. A method of fabricating a capacitor structure, on a semiconductor substrate comprising the steps of:

providing a plurality of gate structures with source/drain regions located in portions of said semiconductor not covered by said gate structures;

depositing a first insulator layer on said gate structures;

forming a plurality of first, second and third storage node contact plugs in said first insulating layer;

forming an etch stop layer on said first insulator layer and on said storage node contact plugs;

depositing a second insulator layer on said etch stop layer;

removing part of said second insulator layer and part of said etch stop layer to expose a plurality of first storage node windows, and a plurality of second storage node windows on said first and second storage node contact plugs;

depositing a first conductive layer on said first storage node window and on said second storage node window to form a first and a second bottom electrode;

removing said first conductive layer and said second insulator layer, located between said first storage node window and said second storage node window to form a patterned first conductive layer;

forming a dielectric layer on said patterned first conductive layer;

depositing a second conductive layer to fill said first storage node window and said second storage node window; and planarizing said second conductive layer to form a top electrode connecting said first and said second bottom electrode.

2. The method of claim 1, further comprising the step of forming shallow trench isolation regions in portions of said semiconductor substrate.

3. The method of claim 1, wherein said first insulator layer is a silicon oxide layer, obtained via LPCVD or PECVD procedures, at a thickness between about 6000 to 10000 Angstroms.

4. The method of claim 1, wherein said first insulator layer is a boro-phosphosilicate glass (BPSG) layer, obtained via LPCVD or PECVD procedures, at a thickness between about 6000 to 10000 Angstroms.

5. The method of claim 1, wherein said storage node contact plugs are comprised of polysilicon, obtained via LPCVD procedures, and either doped in situ during deposition via the addition of arsine, or phosphine, to a silane ambient, or deposited intrinsically then doped via implantation of arsenic or phosphorous ions.

6. The method of claim 1, wherein said etch stop layer is a silicon nitride layer, obtain via LPCVD or PECVD procedures, at a thickness between about 200 to 500 Angstroms.

7. The method of claim 1, wherein said second insulator layer is a silicon oxide layer, obtained via LPCVD or PECVD procedures at a thickness between about 5000 to 20000 Angstroms.

8. The method of claim 1, wherein said second insulator layer is a BPSG layer, obtained via LPCVD or PECVD procedures at a thickness between about 5000 to 20000 Angstroms.

9. The method of claim 1, wherein said storage node windows are formed in said second insulator layer and in said etch stop layer, via an anisotropic RIE procedure, using $CHF_3$ as an etchant for said second insulator layer, and using $CF_4$ as an etchant for said etch stop layer.

10. The method of claim 1, wherein said first conductive layer is comprised of a hemi-spherical grain (HSG) silicon layer, obtained via deposition of a polysilicon or amorphous silicon layer, via LPCVD procedures, followed by an anneal procedure performed in an inert ambient.

11. The method of claim 1, wherein portions of said first conductive layer and portions of said second insulator layer, are removed from between said first storage node window and said second storage node window, via a selective RIE procedure using $Cl_2$ as an etchant for said first conductive layer, and via a selective RIE procedure using $CHF_3$ as an etchant for said second insulator layer.

12. The method of claim 1, wherein said capacitor dielectric layer is an oxidized silicon nitride on oxide (ONO), layer, formed at a thickness between about 30 to 70 Angstroms, via deposition of a silicon nitride-silicon oxide composite layer, followed by thermal oxidation of the silicon nitride layer.

13. The method of claim 1, wherein said second conductive layer is a polysilicon layer, obtained via LPCVD procedures at a thickness between about 3000 to 6000 Angstroms, and either doped in situ during deposition via the addition of arsine, or phosphine to a silane ambient, or deposited intrinsically then doped via implantation of arsenic or phosphorous ions.

14. The method of claim 1, wherein said top electrode is formed via planarization procedures a chemical mechanical polishing procedure.

15. A method of fabricating a capacitor structure for a dynamic random access memory (DRAM) device, on a semiconductor substrate, comprising the steps of:

providing a plurality of gate structures with source/drain regions located in portions of said semiconductor not covered by said gate structures;

depositing a first insulator layer on said gate structures;

forming a plurality of first, second and third storage node contact plugs in said first insulating layer;

forming a silicon nitride etch stop layer on said first insulator layer and on said storage node contact plugs;

depositing a second insulator layer on said silicon nitride etch stop layer;

removing part of said second insulator layer and part of said silicon nitride etch stop layer to expose a plurality of first storage node windows, and a plurality of second storage node windows on said first and second storage node contact plugs;

depositing a first conductive layer, comprised with a roughened top surface, on said first storage node window and on said second storage node window to form a first and a second bottom electrode;

removing said first conductive layer and said second insulator layer, located between said first storage node window and said second storage node window to form a patterned first conductive layer;

forming a dielectric layer on patterned first conductive layer;

depositing a second conductive layer to fill said first storage node window and said second storage node window; and performing a chemical mechanical polishing procedure to planarize said second conductive layer forming a top electrode connecting said first and said second bottom electrodes.

16. The method of claim 15, further comprising the step of forming shallow trench isolation regions in portions of said semiconductor substrate.

17. The method of claim 15, wherein said first insulator layer is a silicon oxide layer, obtained via LPCVD or PECVD procedures, at a thickness between about 6000 to 10000 Angstroms.

18. The method of claim 15, wherein said first insulator layer is a boro-phoshosilicate glass (BPSG) layer, obtained via LPCVD or PECVD procedures, at a thickness between about 6000 to 10000 Angstroms.

19. The method of claim 15, wherein said storage node contact plugs are comprised of polysilicon, obtained via LPCVD procedures, and either doped in situ during deposition via the addition of arsine, or phosphine, to a silane ambient, or deposited intrinsically then doped via implantation of arsenic or phosphorous ions.

20. The method of claim 15, wherein said silicon nitride etch stop layer is obtained via LPCVD or PECVD procedures, at a thickness between about 200 to 500 Angstroms.

21. The method of claim 15, wherein said second insulator layer is a silicon oxide layer, obtained via LPCVD or PECVD procedures at a thickness between about 5000 to 20000 Angstroms.

22. The method of claim 15, wherein said second insulator layer is a BPSG layer, obtained via LPCVD or PECVD procedures at a thickness between about 5000 to 20000 Angstroms.

23. The method of claim 15, wherein said storage node windows are formed in said second insulator layer and in said etch stop layer, via an anisotropic RIE procedure, using $CHF_3$ as an etchant for said second insulator layer, and using $CF_4$ as an etchant for said silicon nitride etch stop layer.

24. The method of claim 15, wherein said first conductive layer, featuring a roughened top surface topography, is comprised of a hemi-spherical grain (HSG) silicon layer, obtained via deposition of a polysilicon or amorphous silicon layer, via LPCVD procedures, followed by an anneal procedure performed in an inert ambient.

25. The method of claim 15, wherein portions of said first conductive layer, and portions of said second insulator layer, are removed from between said first storage node window and said second storage node window via a selective RIE procedure using $Cl_2$ as an etchant for said first conductive layer, and via a selective RIE procedure using $CHF_3$ as an etchant for said second insulator layer.

26. The method of claim 15, wherein said capacitor dielectric layer is an oxidized silicon nitride on oxide (ONO), layer, formed at a thickness between about 30 to 70 Angstroms, via deposition of a silicon nitride-silicon oxide composite layer, followed by thermal oxidation of the silicon nitride layer.

27. The method of claim 15, wherein said second conductive layer is a polysilicon layer, obtained via LPCVD procedures at a thickness between about 3000 to 6000 Angstroms, and either doped in situ during deposition via the addition of arsine, or phosphine to a silane ambient, or deposited intrinsically then doped via implantation of arsenic or phosphorous ions.

* * * * *